United States Patent
Lemke et al.

[11] Patent Number: 6,093,042
[45] Date of Patent: Jul. 25, 2000

[54] HIGH DENSITY CONNECTOR WITH LOW INSERTION FORCE

[75] Inventors: Timothy A. Lemke, Dillsburg; Timothy W. Houtz, Etters; Lewis R. Johnson, Liverpool; Stanley W. Olson, East Berlin, all of Pa.

[73] Assignee: Berg Technology, Inc., Reno, Nev.

[21] Appl. No.: 09/209,132

[22] Filed: Dec. 10, 1998

Related U.S. Application Data

[60] Provisional application No. 60/073,281, Jan. 31, 1998.

[51] Int. Cl.[7] .................................................. H01R 4/50
[52] U.S. Cl. ........................ 439/341; 439/74; 439/376; 439/924.1
[58] Field of Search ............................. 439/341, 51, 376, 439/74, 75, 924.1

[56] References Cited

U.S. PATENT DOCUMENTS

| | | |
|---|---|---|
| 3,133,775 | 5/1964 | Plaxa ........................................ 439/51 |
| 4,257,665 | 3/1981 | John et al. ............................. 439/341 |
| 4,396,140 | 8/1983 | Jaffe et al. ............................. 228/123 |
| 4,503,608 | 3/1985 | Evans ...................................... 439/660 |
| 4,761,140 | 8/1988 | Geib ......................................... 439/71 |
| 4,869,681 | 9/1989 | Vache et al. ............................ 439/341 |
| 4,941,840 | 7/1990 | Okada ..................................... 439/376 |
| 5,000,689 | 3/1991 | Ishizuka et al. ....................... 439/341 |
| 5,215,472 | 6/1993 | DelPrete et al. ........................ 439/71 |
| 5,268,820 | 12/1993 | Tseng et al. ............................. 439/44 |
| 5,302,136 | 4/1994 | Germain et al. ....................... 439/376 |
| 5,378,169 | 1/1995 | Volz et al. ........................... 439/924.1 |
| 5,602,719 | 2/1997 | Kinion .................................... 439/376 |
| 5,649,836 | 7/1997 | Kashiwagi ............................. 439/242 |
| 5,876,219 | 3/1999 | Taylor et al. ............................ 439/74 |

FOREIGN PATENT DOCUMENTS

98/15989  7/1997  WIPO .

*Primary Examiner*—Gary F. Paumen
*Assistant Examiner*—Tho D. Ta
*Attorney, Agent, or Firm*—Brian J. Hamilla; M. Richard Page

[57] ABSTRACT

A connector having a first element and a second element. Each element includes an insulative housing and a plurality of contacts secured to the insulative housing. The elements engage to progressively mate the contacts. A method of mating a connector including the steps of: engaging the first and second elements; and progressively connecting the first and second element contacts.

42 Claims, 13 Drawing Sheets

HIGH DENSITY CONNECTOR WITH LOW INSERTION FORCE

CROSS-REFERENCE TO RELATED APPLICATIONS

This application claims benefit to Provisional Patent Application Ser. No. 60/073,281, filed on Jan. 31, 1998, herein incorporated by reference.

BACKGROUND OF THE INVENTION

1. Field of the Invention

The present invention relates to an electrical connector. More specifically, the present invention relates to a low insertion force electrical connector with a high density of, and a large number of, contacts.

2. Brief Description of Earlier Developments

Improvements in computer systems and communications equipment generally involve miniaturization and increased operating speeds. Designers must adapt the electrical connectors used in these systems to handle such changes.

Several types of electrical connectors exist that have adapted to miniaturization and to the increased operating speeds. One type is a zero insertion force (ZIF) connector. ZIF connectors use a mechanism either to spread a contact apart before receiving its mating contact or to provide mechanical advantage to a contact so that it may spread apart and engage its mating contact.

While beneficial in larger applications, current ZIF designs may not be preferred in high contact density situations. ZIF connectors can be complex and costly, particularly when miniaturization is required. In addition, the smaller actuators may not have sufficient strength to spread a contact apart or to mate the contacts. The actuators also may not fit within footprint limitations. Finally, ZIF connectors may not provide sufficient contact wipe to ensure a stable electrical contact.

Another type of electrical connector uses contacts with differential heights. Some of the contacts reside at one elevation, while the others reside at a different elevation. The taller contacts mate first, followed by the shorter contacts. As a result, the connector exhibits a lower peak insertion force. The peak insertion force is lower because not all of the connectors mate in parallel (i.e. at the same time).

Connectors with differential height contacts, however, may not be preferred in high contact density situations. In miniaturized connectors, producing differential height contacts are viewed as impractical, and are likely to be unsuccessful.

SUMMARY OF THE INVENTION

It is an object of the present invention to provide a connector that provides a reduced peak contact insertion force.

It is a further object of the present invention to provide a connector that selectively mates only a portion of the contacts at a time.

It is a further object of the present invention to provide a connector that sequentially mates the contacts.

It is a further object of the present invention to provide a connector that uses rotation of the connector elements to mate the contacts.

It is a further object of the present invention to provide a connector that precisely aligns the mating contacts during rotation of the connector element.

These and other objects of the present invention are achieved in one aspect of the present invention by a connector having a first and second element. Each element includes an insulative housing and a plurality of contacts secured to the insulative housing. The elements engage in order to progressively mate the contacts.

These and other objects of the present invention are achieved in another aspect of the present invention by a connector having a first and second element rotatably engageable along an axis of rotation. Each element includes an insulative housing and a plurality of contacts secured to the insulative housing. The second element contacts are arranged generally perpendicular to the axis of rotation.

These and other objects of the present invention are achieved in another aspect of the present invention by a method of mating a connector. The connector includes a first and second element. Both elements have an insulative housing and a plurality of contacts secured to the housing. The method includes the steps of: engaging the first and second element; and progressively connecting the first and second element contacts.

These and other objects of the present invention are achieved in another aspect of the present invention by a board-to-board array connector which includes a first and second element, both attachable to respective substrates. The elements each include an insulative housing having an end; a hinge assembly at the end; and a plurality of contacts secured to the housing and arranged in a series of columns parallel to said hinge assembly. The elements are rotated to progressively mate columns of the first and second element contacts in a direction away from the hinge assemblies.

BRIEF DESCRIPTION OF THE DRAWINGS

Other uses and advantages of the present invention will become apparent to those skilled in the art upon reference to the specification and the drawings, in which.

DETAILED DESCRIPTION OF THE PREFERRED EMBODIMENTS

FIGS. 1–12 display several alternative embodiments of the present invention. In general, the present invention is a board-to-board electrical connector having plug and receptacle portions. Rather than mating the contacts in parallel (i.e. all of the contacts at the same time), the plug and receptacle portions sequentially mate the contacts. The present invention achieves sequential mating of the contact by preferably rotating the plug portion relative to the receptacle portion. Hinge assemblies on the plug and receptacle portions interface to allow rotation and to precisely align the contacts on the plug and receptacle portions. The sequential mating of the contacts in the present invention preferably exhibits a lower peak mating force that electrical connectors that mate the contacts in parallel.

Figure 1:
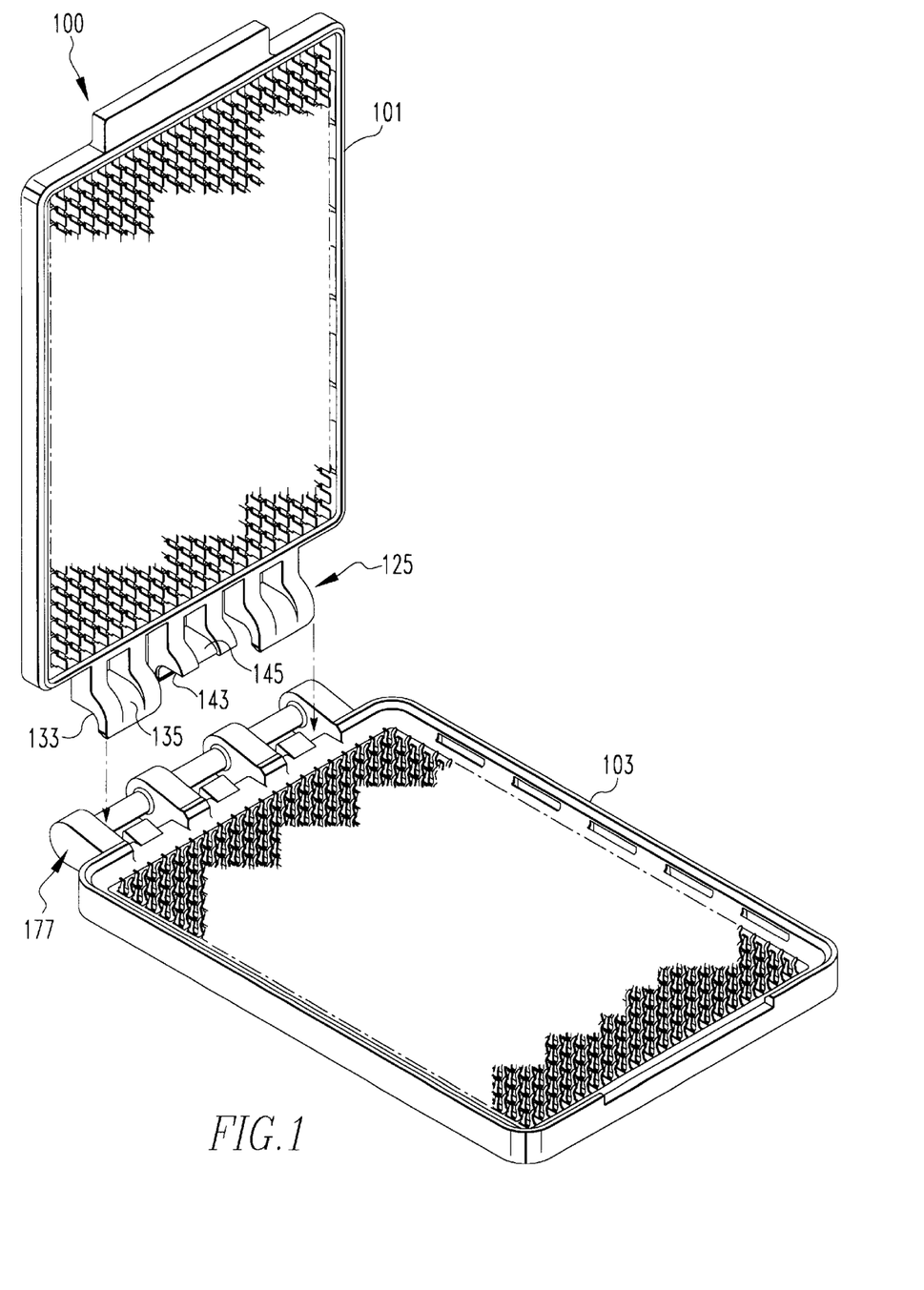
FIG. 1 is a perspective view of a first alternative embodiment of the present invention in an unmated condition.
Figure 2:
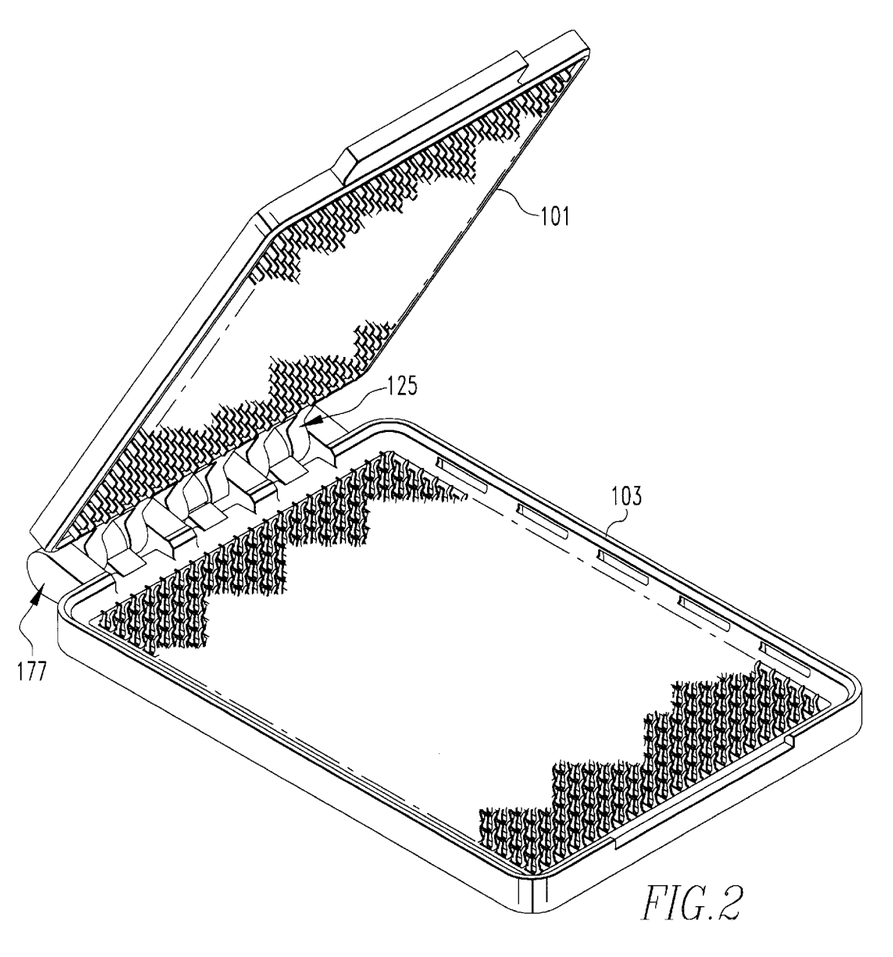
FIG. 2 is a perspective view of the first alternative embodiment in a mated, open condition.
Figure 3:
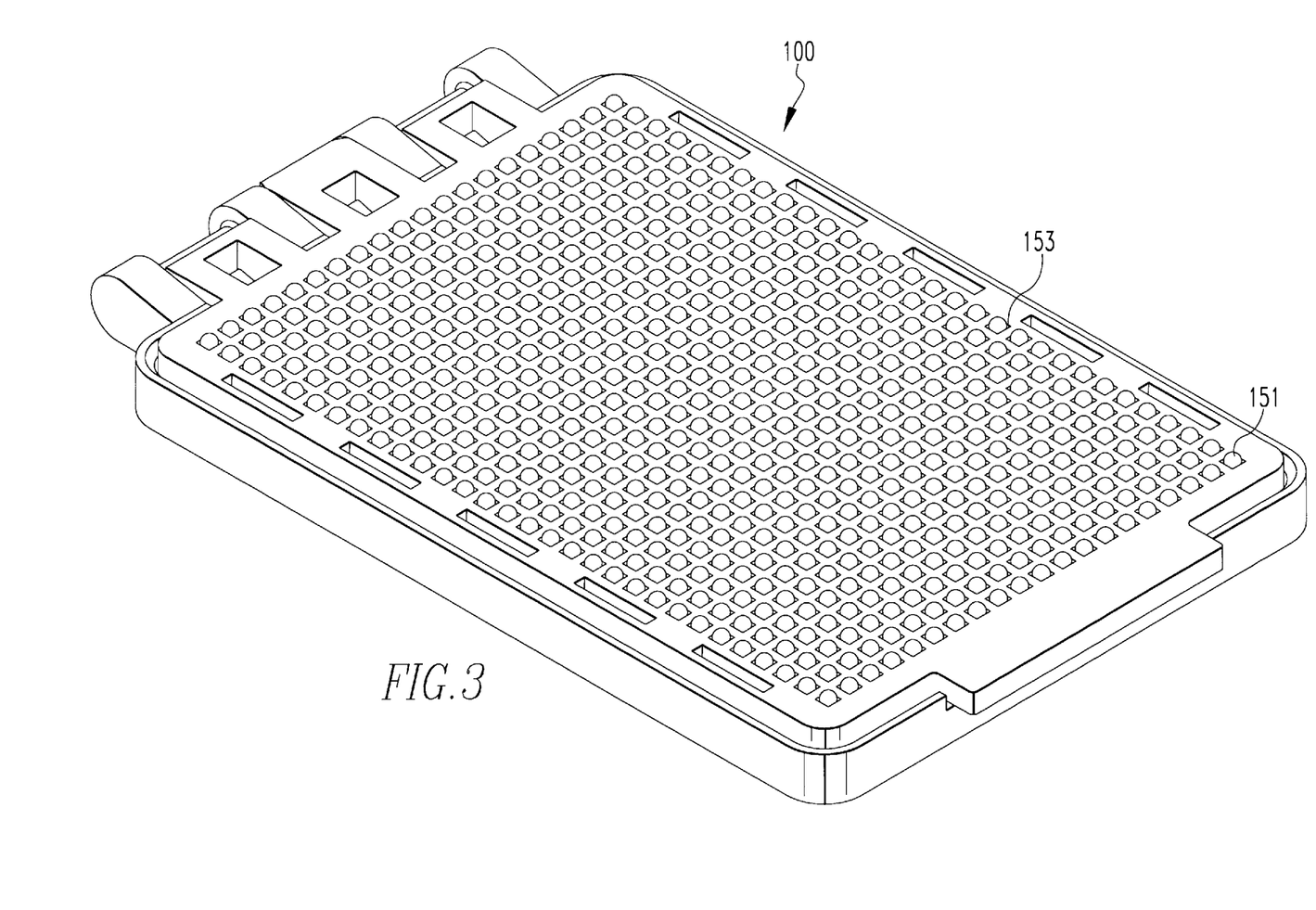
FIG. 3 is a perspective view of the first alternative embodiment in a mated, closed condition.
Figure 4:
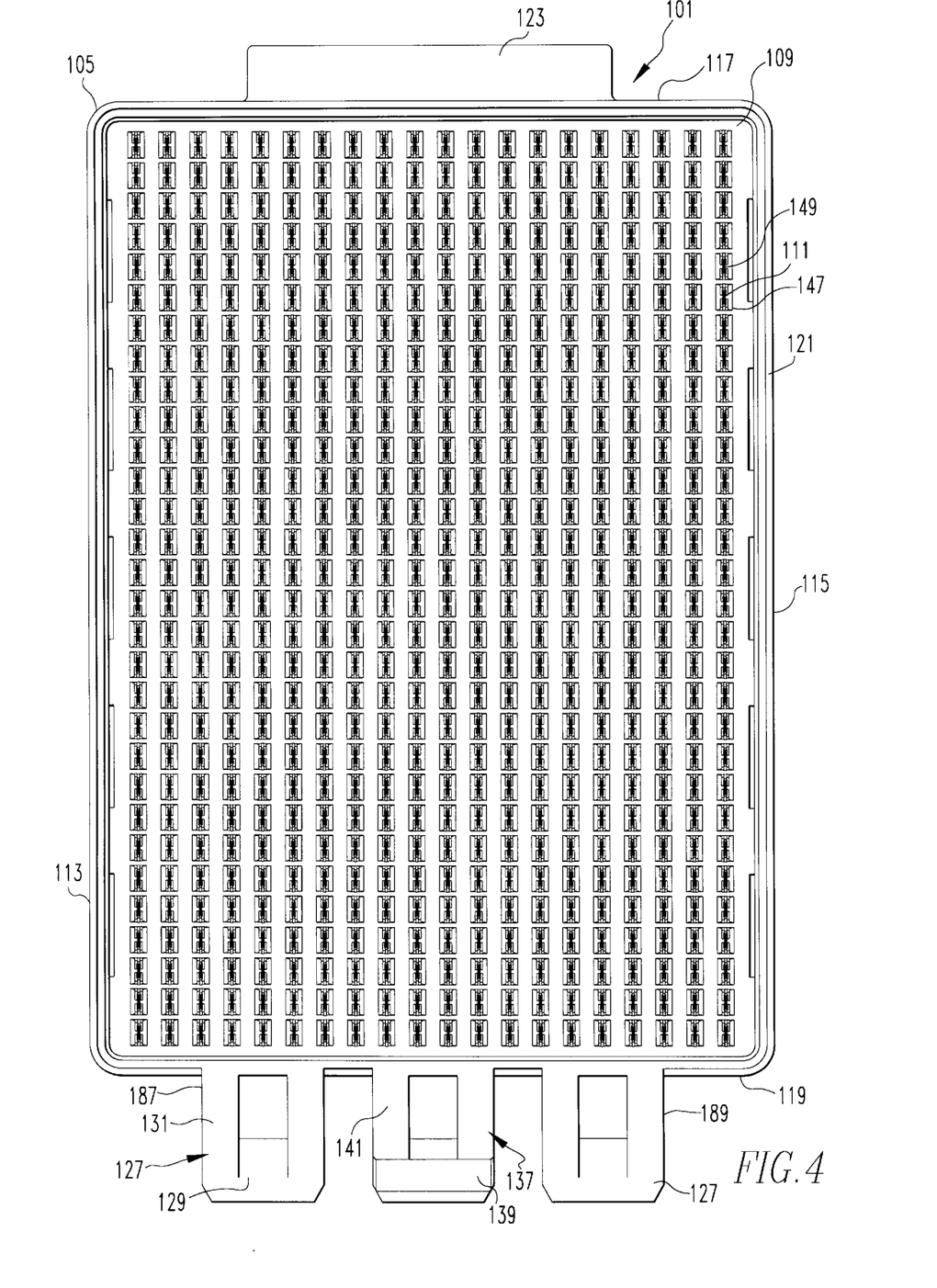
FIG. 4 is a plan view of one component of the first alternative embodiment of the present invention.
Figure 5:
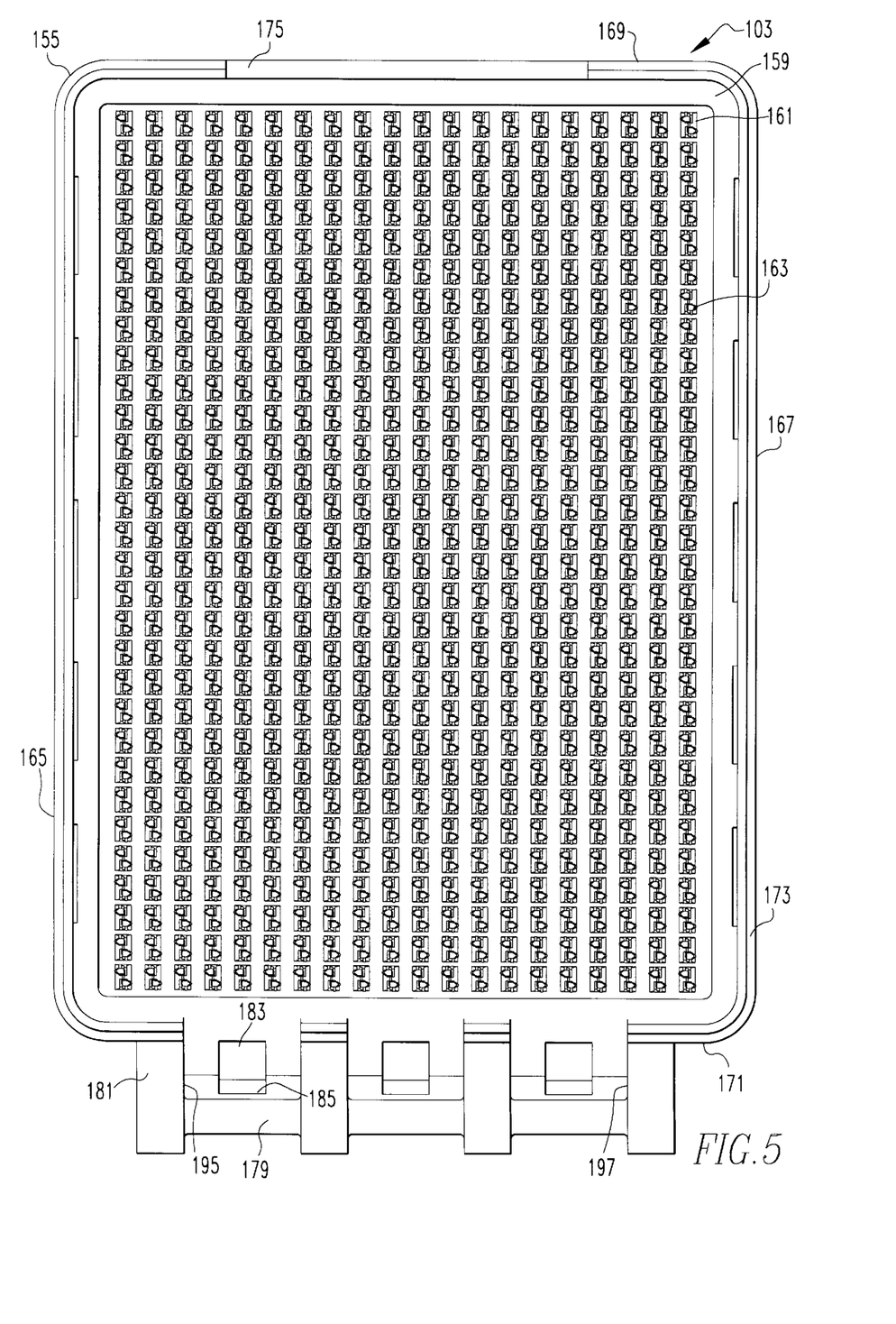
FIG. 5 is a plan view of another component of the first alternative embodiment of the present invention.
Figure 6:
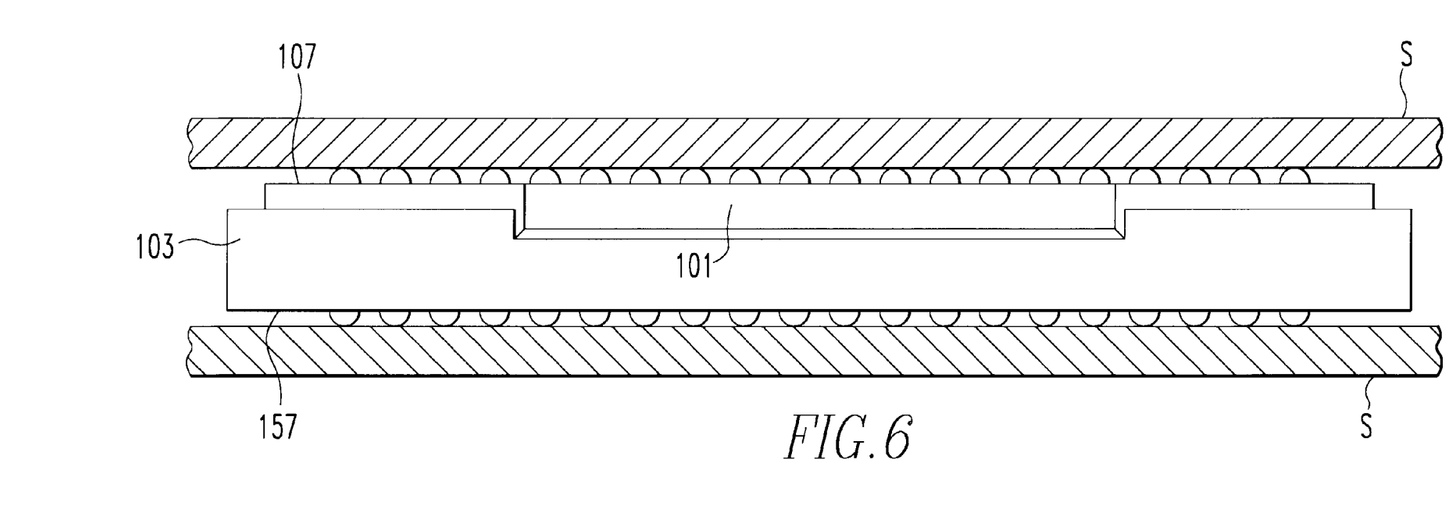
FIG. 6 is a side view of the first alternative embodiment in a mated, closed condition.

FIGS. 1–6 display one alternative embodiment of the present invention. An electrical connector 100 includes a plug portion 101 and a receptacle portion 103. Connector 100 preferably interconnects two substrates S such as printed circuit boards (PCBs) as seen in FIG. 6. Plug 101 and receptacle 103 are removably engageable as shown in FIG. 1–3. Once engaged, plug 101 can rotate relative to receptacle 103 from the open position shown in FIG. 2 to the closed position shown in FIG. 3. Rotation of plug 101 relative to receptacle 103 allows the sequential mating of the contacts. Plug 101 and receptacle 103 will now be individually described in greater detail.

As seen in FIGS. 1 and 4, plug 101 has a generally planar insulative housing 105, preferably manufactured from a plastic, such as liquid crystal polymer (LCP). Housing 105 has a mounting end 107 that faces substrate S and a mating end 109 that faces receptacle 103. An array of apertures 147 extend through housing 105 from mounting end 107 to mating end 109.

An array of contacts 111 reside within apertures 147 in housing 105. Apertures 147 preferably retain contacts 111 within housing 105 using, for example, a projection 149 extending into aperture 147 from a side wall. Contacts 111 remain within apertures 147 by an interference fit with projection 149. As seen in FIG. 4, each contact 111 generally parallels sides 113, 115 of housing 105, and is generally perpendicular to a leading edge 117 and a trailing edge 119 of housing 105. Since plug 101 and receptacle 103 mate along an axis that is generally parallel to trailing edge 119, contacts 111 are also generally perpendicular to the mating axis of connector 100.

Contacts 111 form a series of rows and columns on housing 105. As used throughout, a row refers to a group of contacts 111 that extend along the length of housing 105 from leading edge 117 to trailing edge 119. A columns refer to a group of contacts 111 that extend along the width of housing 105 between sides 113, 115.

Although the figures display blade-type contacts on the plugs, other types of contacts, such as round pins, could be used with the present invention. In addition, the connector could employ several different types of contacts at one time. For example, some contacts could carry a signal or ground, while others carry power. This, for example, allows the connectors of the present invention to be hot matable.

Housing 105 has a wall 121 extending around the perimeter to protects contacts 11 from damage. As seen in FIG. 1, wall 121 could extend around the entire perimeter of housing 105.

Leading edge 117 of housing 105 includes a tab 123 to assist the user in rotating plug 101 to mate and to unmate with receptacle 103. Trailing edge 119 of housing 105 includes a hinge assembly 125 that allows plug 101 to rotate relative to receptacle 103 and to properly align the contacts on plug 101 and receptacle 103. Hinge assembly 125 extends generally parallel to the plane of housing 105. A description of the components of hinge assembly 125 follows.

A pair of extensions 127 project outwardly from trailing edge 119 of housing 105, each adjacent a respective side 113, 115. Each extension 127 has a curved element 129 flanked by a pair of arms 131. As seen in FIG. 1, curved elements 129 have a first surface 133 shaped to engage a hinge pin on receptacle 103 and a second surface 135 opposite first surface 133 shaped to interact with a block 183 on receptacle 103.

Each outermost arm 131 has an outwardly facing, or exterior surface 187, 189. Surfaces 187, 189 interact with corresponding surfaces on the hinge assembly of receptacle 103 to ensure proper alignment of the contacts during mating.

A centrally located extension 137 also projects outwardly from a central location on trailing edge 119 of housing 105, but extends in a direction opposite of extensions 127. Central extension 137 has a curved element 139 flanked by a pair of arms 141. Curved elements 139 have a first surface 143 shaped to engage a hinge pin on receptacle 103 and a second surface 145 opposite first surface 133 shaped to interact with a block on receptacle 103.

As seen in FIG. 6, connector 100 provides a board-to-board interconnection. Accordingly, plug 101 must mount to substrate S, preferably prior to mating with receptacle 103. Plug 101 preferably mounts to substrate S using reflow techniques, in particular Ball Grid Array (BGA) technology. As seen in FIG. 3, a fusible element 151, such as a solder ball, secures to a tail portion (not shown) of contact 111. International Publication number WO 98/15989 (International Application number PCT/US97/18066), herein incorporated by reference, describes methods of securing a solder ball to a contact. Fusible element 151 resides, at least partially, within an enlarged portion 153 of aperture 147.

FIG. 5 shows receptacle 103 having a generally planar insulative housing 155, preferably manufactured from a plastic such as LCP. Housing 155 has a mounting end 157 facing substrate S and a mating end 159 facing plug 101. An array of apertures 161 extend through housing 155 from mounting end 157 to mating end 159.

An array of contacts 163 reside within apertures 161 in housing 155. Contacts 163 can be dual beam contacts and can be retained by the apertures in the same manner as described earlier and as described in International Publication number WO 98/15989. As seen in FIG. 5, each contact 163 generally parallels sides 165, 167 and is generally perpendicular to a leading edge 169 and a trailing edge 171 of housing 155. Since plug 101 and receptacle 103 mate along an axis that is generally parallel to trailing edge 171, contacts 163 are also positioned generally perpendicular to the mating axis of connector 100.

In order to mate with contacts 111 of plug 101, contacts 163 of receptacle 103 form a series of rows and columns on housing 155. As seen in FIGS. 1 and 2, contacts 163 preferably all have the same elevation. This simplifies the assembly of receptacle 103.

Also shown in FIGS. 1 and 2, the individual beams of each dual beam contact 163 preferably have the same length as the other beam. This reduces the amount of material required to form the contact and simplifies the contact forming process.

Housing 155 can have a wall 173 extending around the perimeter to protect contacts 163 from damage. As seen in FIG. 5, wall 173 does not extend around the entire perimeter of housing 155. Wall 173 has a discontinuity at trailing edge 165. The discontinuity in wall 173 allows hinge assembly 125 of plug 101 to interact with the hinge assembly of receptacle 103 for complete mating of plug 101 and receptacle 103.

Wall 173 includes a recessed portion 175 at leading edge 163 of housing 151. Recessed portion 175 receives tab 123 on plug 101 when in the mated, closed condition shown in FIGS. 3 and 6.

Trailing edge 171 of housing 155 includes a hinge assembly 177 that allows plug 101 to rotate relative to receptacle 103. Hinge assembly 177 extends generally parallel to the plane of housing 155. Hinge assembly 177 includes a hinge pin 179 braced by a series of supports 181 along trailing edge 171 of housing 155.

A series of blocks 183 extend from trailing edge 171 between adjacent supports 181. Blocks 183 have curved surfaces 185 that correspond to second surfaces 133, 143 of extensions 127 and central extension 137, respectively. Curved surfaces 185 of blocks 183 have substantially the same shape as second curved surfaces 135, 145 of extensions 127 and central extension 137. Specifically, curved surfaces 135, 145, 185 are circular and have generally the same radius of curvature to ensure proper meshing of hinge assemblies 125, 177 along the entire mating path. Precise movement of hinge assemblies 125, 177 ensures proper alignment of contacts 111, 163 in plug 101 and receptacle 103 during mating.

Each outermost support 181 includes an interior, or inwardly facing surface 195, 197 of an adjacent block 183. Surfaces 195, 197 interact with surfaces 187, 189 of hinge assembly 125 to ensure proper alignment of the contacts during mating. Specifically, surfaces 187, 189 abut surfaces 195, 197 to laterally align plug 101 relative to receptacle 103. This helps ensure proper alignment of contacts 111, 163 during mating.

As previously discussed, connector 100 provides a board-to-board interconnection. Receptacle 103 preferably mounts to substrate S using reflow techniques, in particular BGA technology. A fusible element, such as a solder ball, secures to a tail portion (not shown) of contact 163 using, for instance, the methods described in the aforementioned International Publication number WO 98/15989. The fusible element resides, at least partially, within an enlarged portion (not shown) of aperture 161 similar to enlarged portion 153 of plug 101.

The mating of plug 101 and receptacle 103 will now be described with reference to FIGS. 1–3. Initially, plug 101 and receptacle 103 are separate, or unmated, as shown in FIG. 1. To interface plug 101 and receptacle 103, hinge assemblies 125, 177 must mesh as shown in FIG. 2. The features of hinge assemblies 125, 177, plug 101 and receptacle enhance the ease of blind mating plug 101 and receptacle 103.

Describing the mating in particular, extensions 127 and central extension 139 enter the openings formed between hinge pin 179, extensions 181 and trailing edge 171 of housing 155. Arms 131, 141 of hinge assembly 125 enter the areas flanking blocks 183 of hinge assembly 177. Outer surfaces 187, 189 of arms 131 abut inner surfaces 195, 197 of supports 181 to laterally align plug 101 with receptacle 103 along an axis parallel to trailing edges 119, 171.

In the mated, open condition shown in FIG. 2, curved surfaces 185 of blocks 183 begin to abut second surfaces 135, 145 of extensions 127 and central extension 137. Surfaces 135, 145, 185 help longitudinally align plug 101 and receptacle 103 along an axis parallel to sides 113, 115, 165, 167 of plug 101 and receptacle 103. Preferably, the other adjacent surfaces of arm 131, supports 181 and blocks 185 have a clearance therebetween to reduce the amount of force required to rotate plug 101.

Extensions 127 and central extension 137 provide a retaining force on opposite sides of hinge pin 179 due to the opposite orientation of central extension 137 relative to extensions 127. The retaining forces, along with the placing of extensions 127 and central extension 137 between hinge pin 179 and trailing edge 119 of housing 105 prevents separation of plug 101 from receptacle 103. In other words, plug 101 can only separate from receptacle 103 by reversing the mating process (i.e. rotating plug 101 away from receptacle 103).

The rotation of plug 101 begins the mating of contacts 111, 163. Each contact 111 progressively enters into the space between the opposed arms of the dual beam contacts 163 during rotation. Each arm of the dual beam contact 163 interacts with an opposite surface of blade contact 111. Contact 163 retains contact 111 between its resilient dual beams. The area between the dual beams of each contact 163 is generally parallel to the mating axis of plug 101 and receptacle 103.

The column of contacts 111, 163 closest to trailing edges 119, 171 of plug 101 and receptacle 103 mate first. Mating progresses with each subsequent column away from trailing edges 119, 171 of plug 101 and receptacle 103.

FIGS. 3 and 6 shows connector 100 in a fully mated and closed condition. While mated, wall 173 of receptacle 103 can surround wall 121 of plug 101 and tab 123 rests within recess 175 in leading edge 169 of receptacle 103.

The difference in the coefficient of thermal expansion (CTE) of the substrates and the connector, and coplanarity of the fusible elements are two important considerations with large scale array connectors. CTE differential can introduce stress into the solder joints that couple the connector and the substrate. Solder joint stress potentially reduces the thermal reliability of the connector. CTE differential can also warp the connector. Connector warp potentially misaligns the mating connectors, increasing the required peak insertion force. Connector warp may also affect the coplanarity of the fusible elements that couple the connector to the substrate.

FIGS. 7–12 display another alternative embodiment of the present invention. This embodiment helps offset the effects of CTE differential and helps improve coplanarity by using a modular approach. The alternative embodiment utilizes several smaller components rather than a unitary, larger component.

Figure 12:
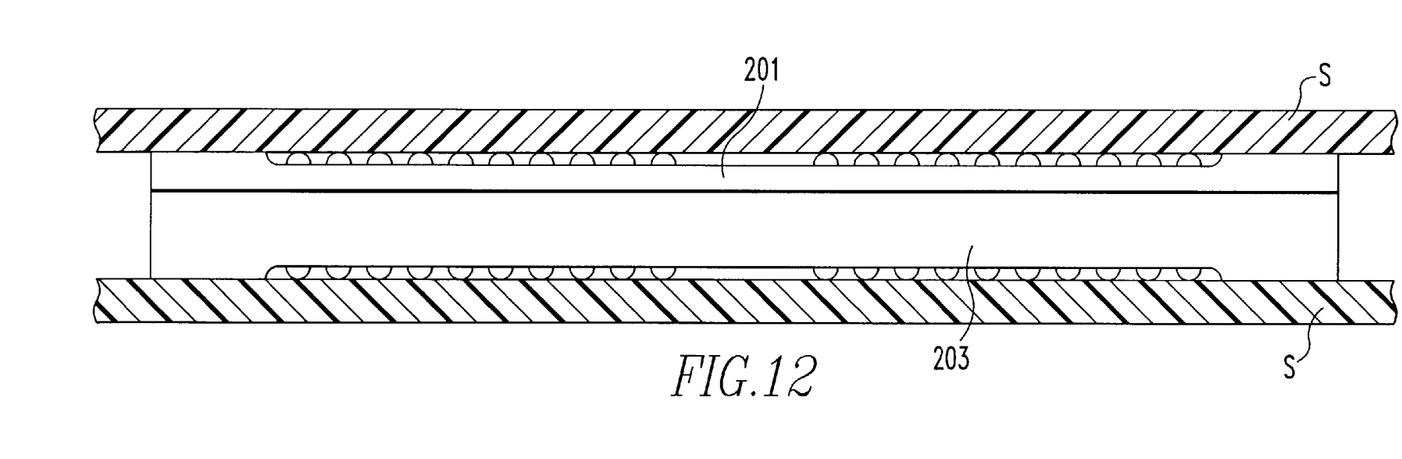
FIG. 12 is a side view of the second alternative embodiment in a mated, closed condition.

An electrical connector 200 includes a modular plug portion 201 and a modular receptacle portion 203 for interconnecting two substrates S as shown in FIG. 12. Plug 201 and receptacle 203 are removably engageable from the unmated condition shown in FIG. 7 to the intermediate, mated, open condition shown in FIG. 8, and ending at the mated, closed condition shown in FIG. 9. Rotation of plug 201 relative to receptacle 203 allows the sequential mating of the contacts. Plug 201 and receptacle 203 will now be described in detail.

Figure 7:
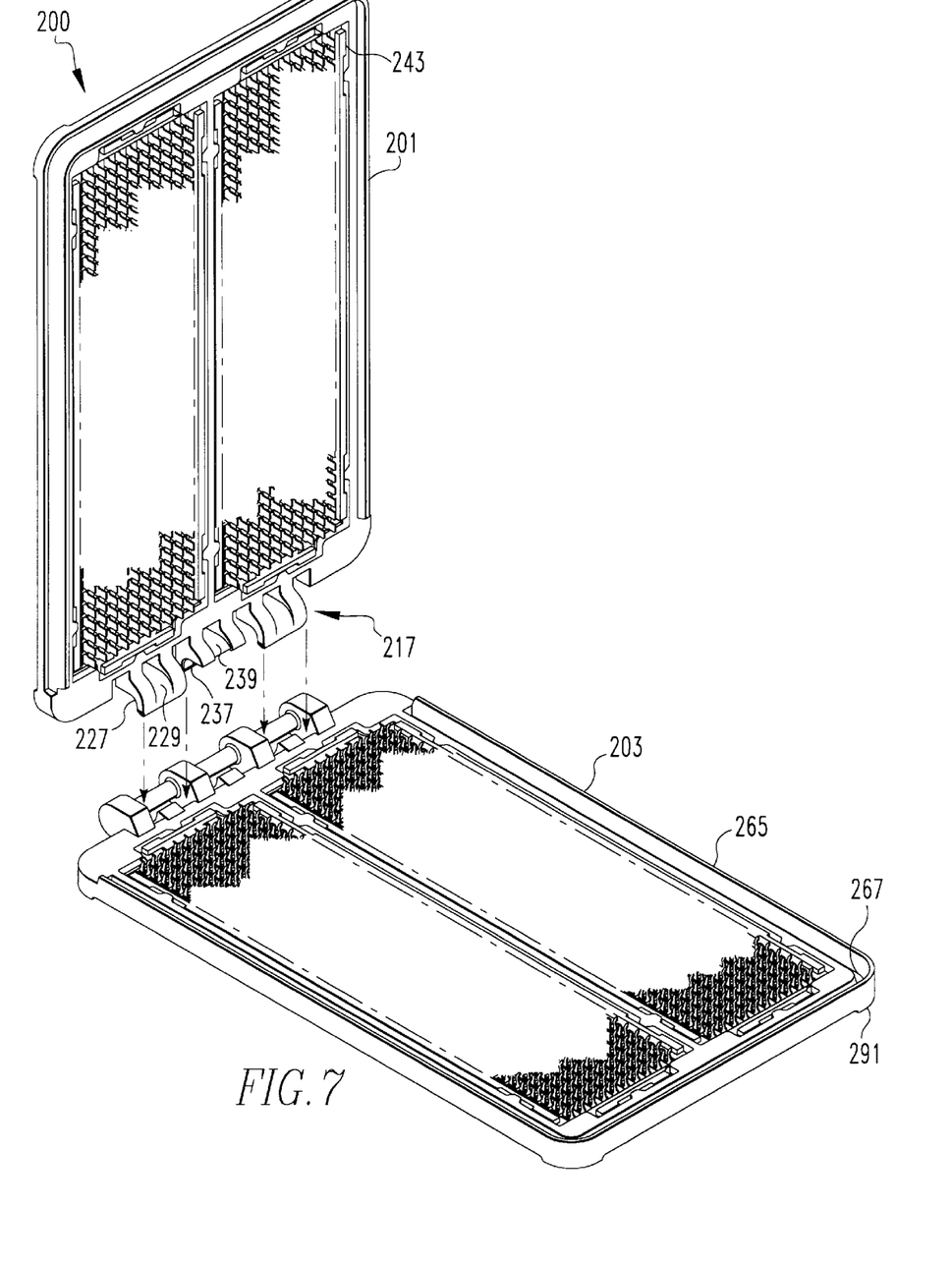
FIG. 7 is a perspective view of a second alternative embodiment of the present invention in an unmated condition.
Figure 9:
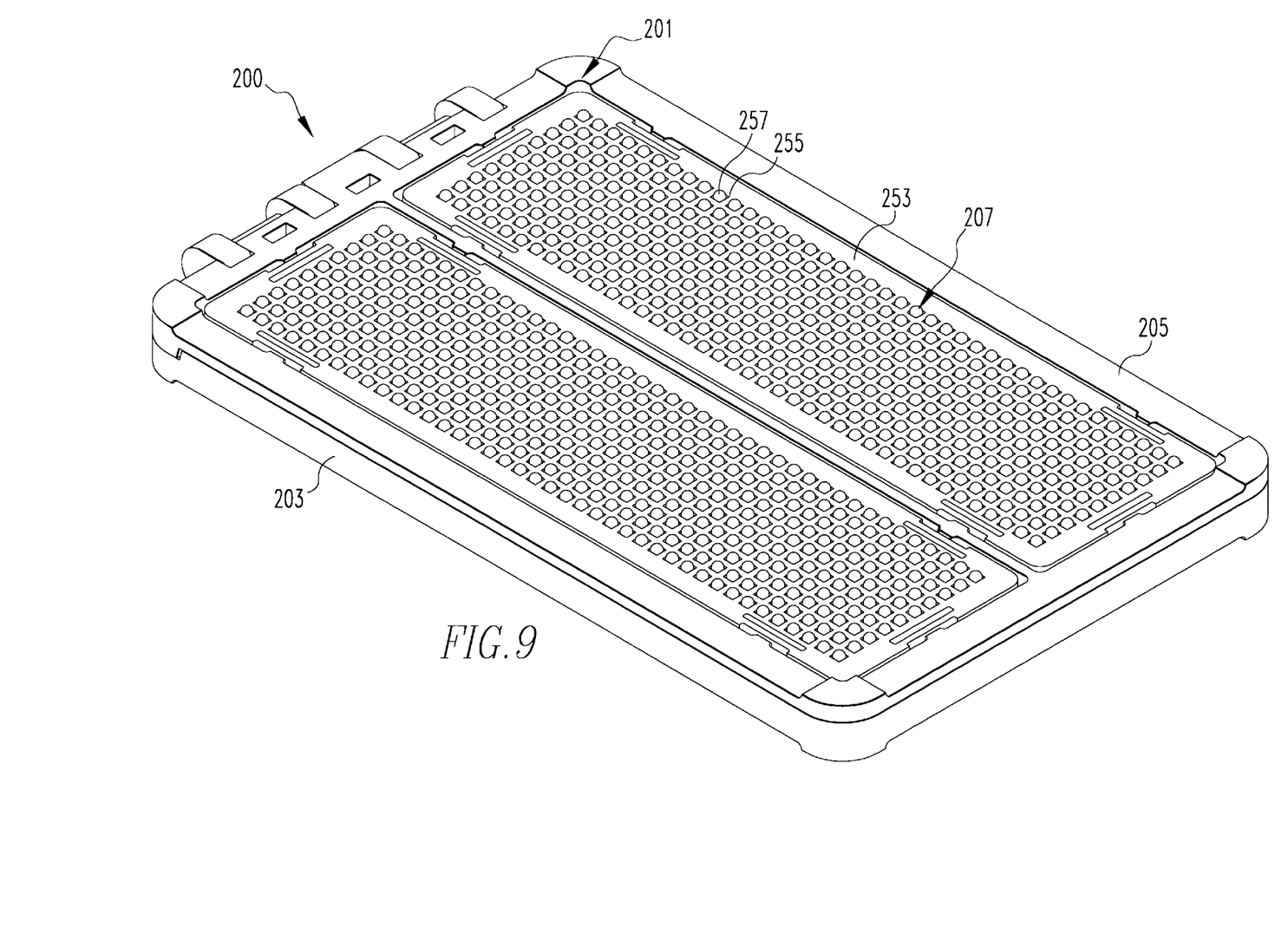
FIG. 9 is a perspective view of a second alternative embodiment of the present invention in a mated, closed condition.
Figure 10:
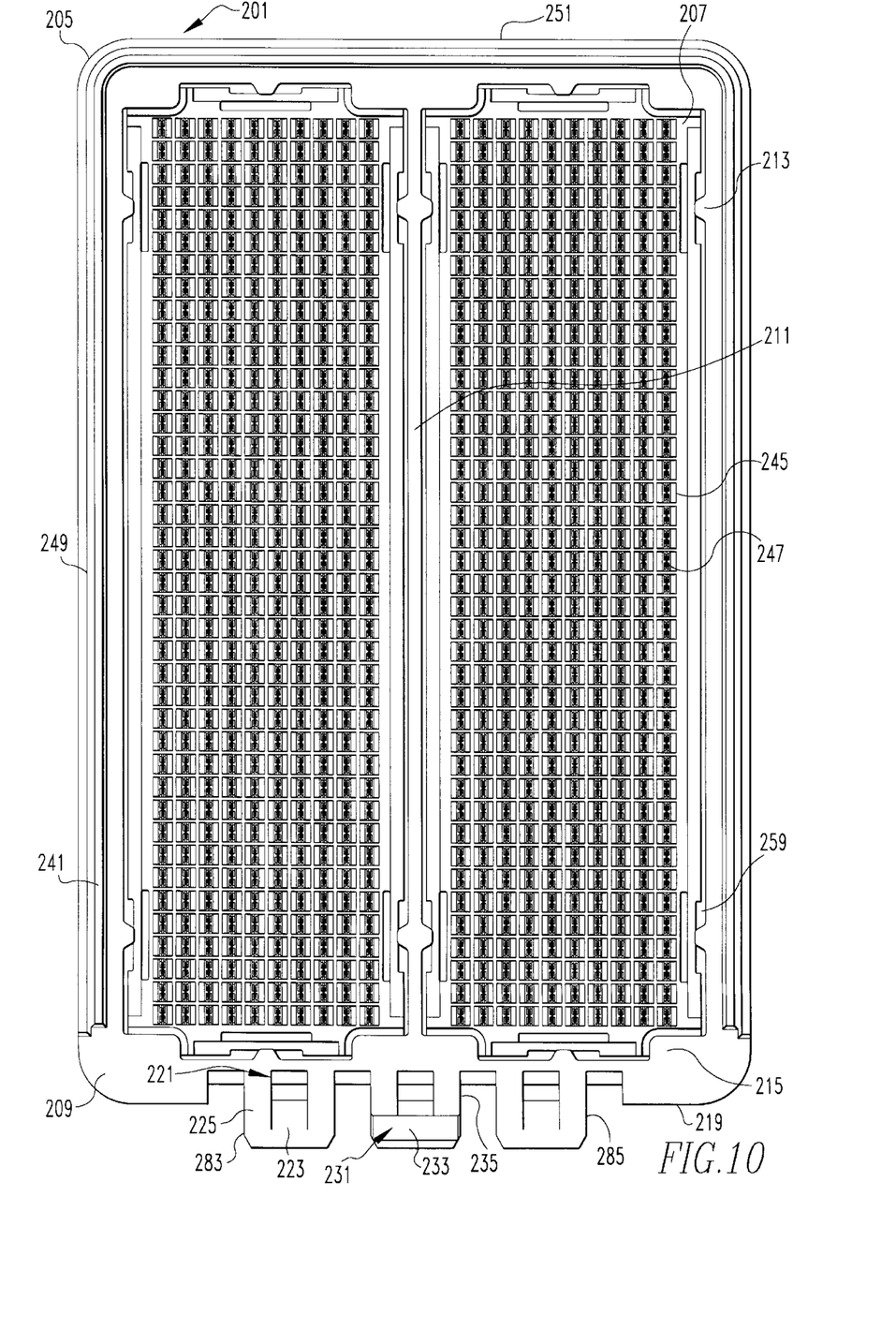
FIG. 10 is a plan view of one component of the second alternative embodiment of the present invention.

As shown in FIGS. 7, 9 and 10, one component of modular plug 201 is a frame 205 that supports the remaining components. Frame 205 is made of a suitable material, including plastic or metal. Frame 205 can secure to substrate S using, for example, solder or a fastener (not shown). Frame 205 can provide additional rigidity to substrate S and may serve as a shield, to nearby electrical components, from electromagnetic interference (EMI).

Frame 205 has an outer wall 209 defining an opening sized to receive a desired number of removable housings 207. As seen in FIG. 10, the opening is slightly larger than housing 207. When receiving more than one housing 207, frame 205 may include a web 211 that extends between opposed sides of frame 205. Webs 211 add rigidity to frame 205 and also help retain housing 207. In this instance, outer wall 209 and web 211 define the openings for housings 207.

Wall 209 and web 211 have projections 213 extending into the opening. Projections 213 engage side walls of housing 207 and maintain housing 207 away from wall 209. In other words, projections 213 provide a gap between housing 207 and wall 209 to accommodate any housing size variations and any movement of plug 201 during thermal cycles.

Wall 209 also has tabs 215 extending into the opening. In addition to engaging projections 213, housing 207 rests on tabs 215 when fully inserted within the opening. The combination of housing 207 resting on tabs 215 and projections 213 engaging housing 207 ensures the retention of housing 207 within frame 205.

Frame 205 includes a hinge assembly 217 at a trailing edge 219 to allow rotation of plug 201 relative to receptacle 203. Frame 205 can be made from metal when, for example, conditions require additional strength from connector 200 or connector 200 will be subjected to numerous mating cycles.

Hinge assembly 217 includes extensions 221 projecting from trailing edge 219 of frame 205. Each extension 221 has a curved element 223 flanked by a pair of arms 225. Curved elements 223 have a first surface 227 shaped to engage a hinge pin on receptacle 203 and a second surface 229 opposite first curved surface 227 shaped to engage a block 277 on receptacle 203.

Each outermost arm 225 includes an outwardly facing, or exterior surface 283, 285. Surfaces 283, 285 interact with corresponding surfaces on the hinge assembly of receptacle 203 to ensure proper alignment of the contacts during mating.

A centrally located extension 231 also projects outwardly from a central location on trailing edge 219 of frame 205, but extends in a direction opposite of extensions 221. Central extension 231 has a curved element 233 flanked by a pair of arms 235. Curved elements 233 have a first surface 237 shaped to engage a hinge pin on receptacle 203 and a second surface 239 opposite first curved surface 237 shaped to interact with block 277 on receptacle 203.

Plug 201 includes a wall 241 projecting from a mating end 243 that faces receptacle 203. Wall 241 at least partially extends around the perimeter of frame 205. As seen in FIG. 10, wall 241 does not reside along trailing edge 219 so as not to interfere with hinge assembly 217. Wall 241 can protect contacts 247 on housing 207 from damage.

When soldered to substrate S, frame 205 can include solder pads 291. Solder pads 291 elevate the remainder of frame 205 from substrate S. Solder pads 291 may help transfer heat to the solder balls on housing 207 during the reflow process and may aid in any visual inspection of the solder balls after securing plug 201 to substrate S. In addition, solder pads 291 can aid in any cleaning that must be done between frame 205 and substrate S after securing to substrate S.

Frame 205 can also secure to substrate S in other manners. For example, frame 205 could have apertures (not shown) therethrough to receive a fastener (not shown), such as a screw, securable to substrate S.

The remaining component of modular plug 201 is at least one housing 207. Housing 207 is generally planar and preferably manufactured from a suitable plastic, such as liquid crystal polymer (LCP). Housings 207 seat within the opening in frame 205.

An array of apertures 245 extend through housing 207. Contacts 247 reside within apertures 245, preferably by interference fit. FIG. 10 displays contacts 247 as blade-type contacts, however other types of contacts, including round pins, could be used.

Contacts 247 form a series of rows and columns on housing 205. Each contact 247 generally parallels a side 249 of plug 201 and is generally perpendicular to a leading edge 251 of plug 201.

At a mounting end 253 of housing 207, aperture 245 has an enlarged opening 255 to receive at least a portion of a fusible element 257, such as a solder ball. Fusible element 257 secures to a tail end of contact 247. As discussed with the first embodiment, International Publication number WO 98/15989 (International Application number PCT/US97/18066) describes methods of securing a solder ball to a contact.

Housing 207 can have notches 259 along its outer wall. Some notches 259 are sized to correspond to projections 213 of frame 205, while other notches 259 are sized to correspond to tabs 215 of frame 205. Notches 259 help align housing 207 within the opening in frame 205.

Save a few features, receptacle 203 is identical to plug 201. In order to avoid repetition, the following provides only a brief summary of the features of receptacle 203 that are similar to features in plug 201 and a more detailed description of the features that differ from plug 201.

Modular receptacle 203 uses a frame 261 that receives at least one removable housing 263. Frame 261 has a wall 265 bordering a portion of the perimeter. Wall 265 can help protect the contacts of housing 263. To receive wall 241 of plug 201 during mating, frame 261 has a channel 267 located inwardly from wall 265.

Frame 261 includes a hinge assembly 269 similar to the hinge assembly in the first alternative embodiment of the present invention. Hinge assembly 269 includes a hinge pin 271 braced by a series of supports 273 along a trailing edge 275 of frame 261.

A series of blocks 277 extend from trailing edge 275 of frame 261 between adjacent supports 273. Blocks 277 have curved surfaces 279 that correspond to second curved surfaces 229, 239 of extensions 221, 231, respectively. Curved surfaces 279 of blocks 277 have substantially the same shape as second curved surfaces 229, 239 of extensions 221, 231. Specifically, curved surfaces 229, 239, 279 are circular and have generally the same radius of curvature to ensure proper meshing of hinge assemblies 217, 269 along the entire mating path. Precise movement of hinge assemblies 217, 269 ensures proper alignment of contacts 247, 281 in plug 201 and receptacle 203 during mating.

Figure 8:
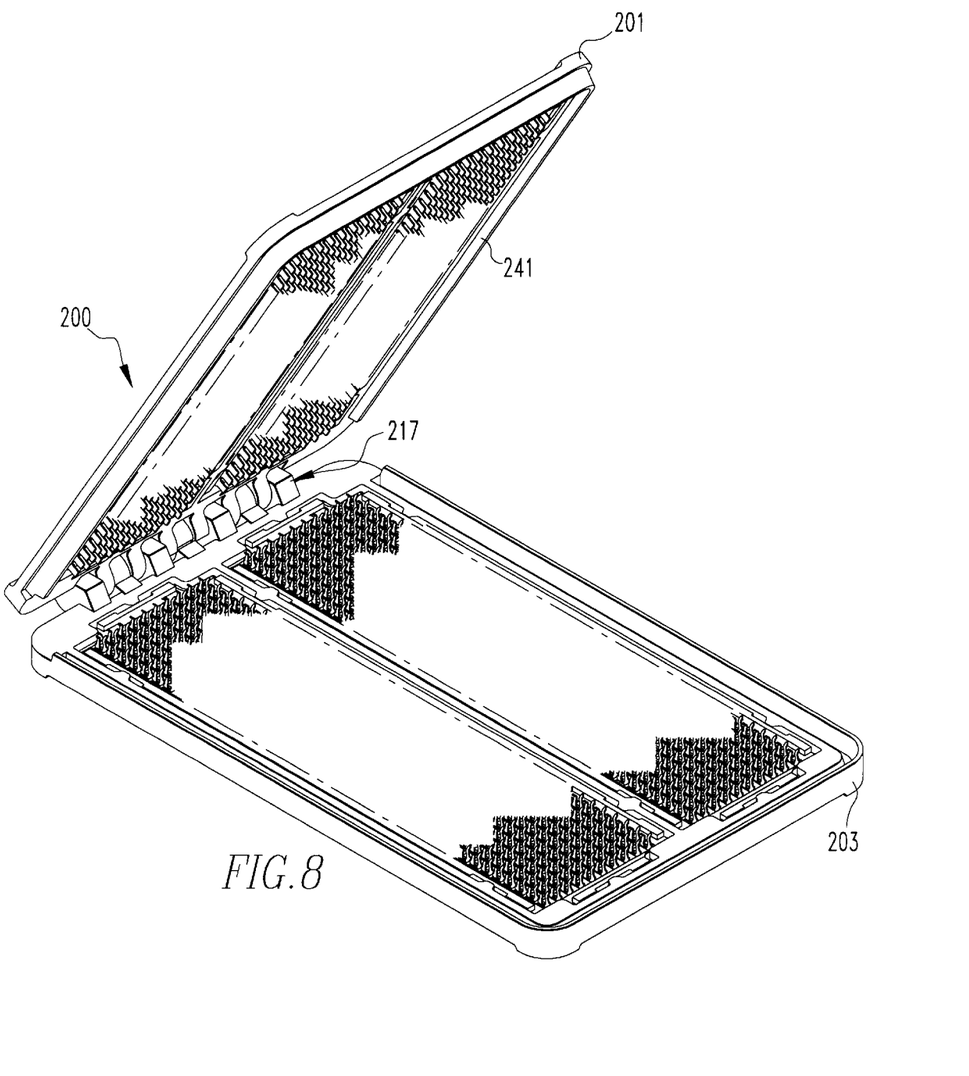
FIG. 8 is a perspective view of a second alternative embodiment of the present invention in a mated, open condition.

Each outermost support 273 includes an interior, or inwardly facing surface 291, 293. Surfaces 291, 293 interact with surfaces 283, 285 of hinge assembly 217 to ensure proper alignment of the contacts during mating. Specifically, outer surfaces 283, 285 abut surfaces 291, 293 to laterally align plug 201 relative to receptacle 203. This helps ensure proper alignment of contacts 247, 281 during mating. The mating of plug 201 and receptacle 203 proceeds as shown in FIGS. 7–9 in the manner described above with respect to the first embodiment.

Figure 11:
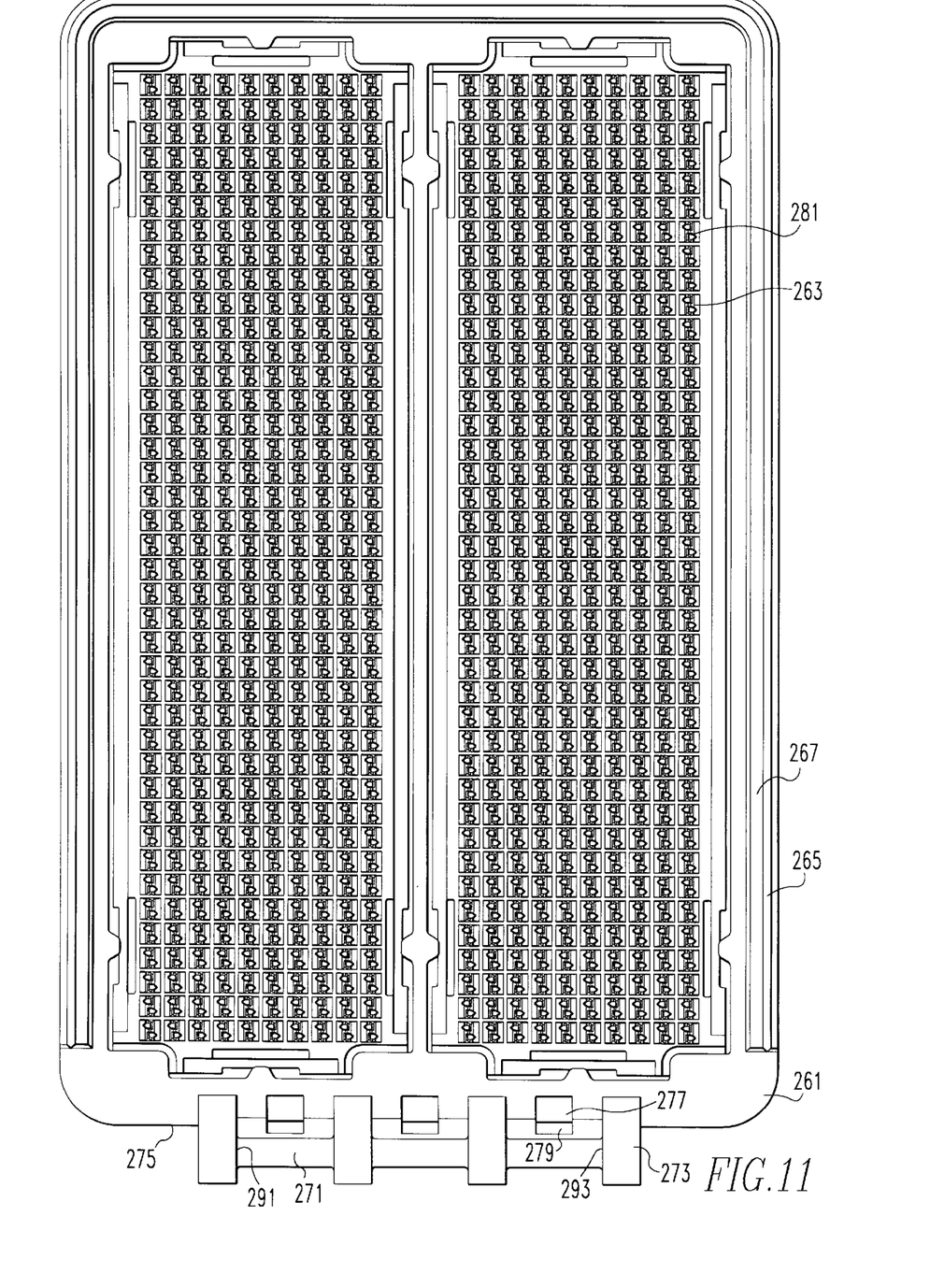
FIG. 11 is a plan view of another component of the second alternative embodiment of the present invention.

Housing 263, save the type of contact, is identical to housing 207 of plug 201. FIG. 11 demonstrates housing 263 using a dual beam-type contact 281 to mate with blade-type contact 247 of plug 201. As with contact 247, contact 281 can be any suitable type of contact.

Figure 13:
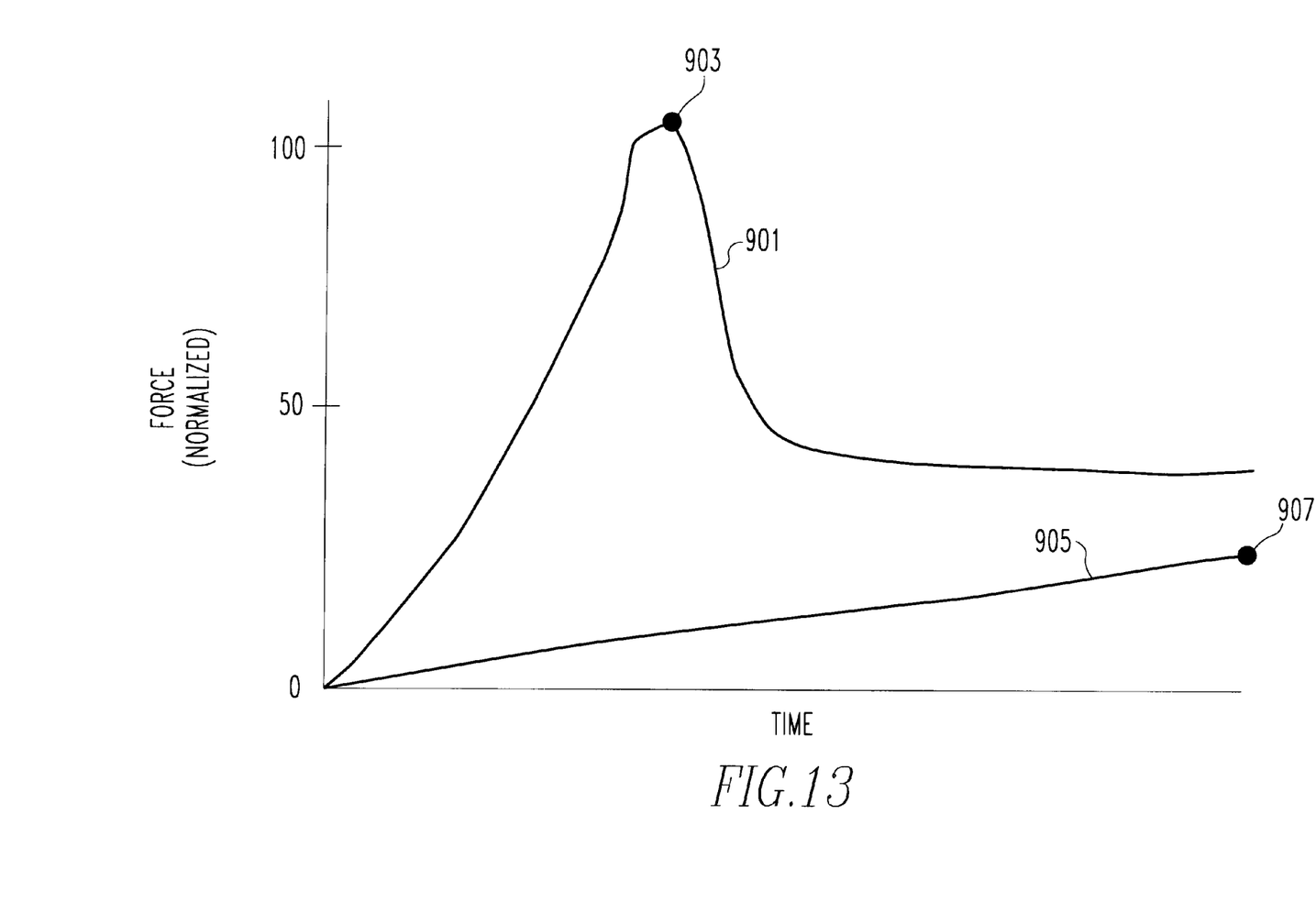
FIG. 13 is a graph depicting the insertion forces for mating a conventional connector compared to mating a connector of the present invention.

FIG. 13 compares the estimated insertion forces for a typical connector and a connector of the present invention. As used herein, a typical connector refers to a connector in which all of the contacts mate in parallel. In other words, a typical contact mates all of the contacts at the same time. A typical connector produces the insertion force-versus-time path designated 901 in FIG. 13. A typical connector exhibits a peak at the point designated 903 along path 901. The peak is located approximately midstream along the time period.

A connector of the present invention (using the same number of contacts, but sequentially mated) produces the insertion force-versus-time path designated 905 in FIG. 13. The connector of the present invention exhibits a peak at the point designated 907 along path 905. The peak is located approximately at the end of the time period. Clearly, the peak insertion force 907 of a connector of the present invention is well below the peak insertion force 903. of a typical connector.

While the present invention has been described in connection with the preferred embodiments of the various figures, it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. A connector, comprising:
   a first element including:
      a first insulative housing;
      a plurality of first contacts secured to said first insulative housing; and
      a first hinge assembly on said first element, said first hinge assembly:
         a hinge pin;
         a plurality of supports connected to said hinge pin; and
         a block residing between adjacent supports; and
   a second element engageable with said first element and including:
      a second insulative housing;
      a plurality of second contacts secured to said second insulative housing and matable with said first contacts; and
      a second hinge assembly on said second element, second hinge assembly having at least one extension with a front face for engaging said hinge pin and a rear face for engaging said block;
   whereby the connector progressively mates said first and second contacts.

2. The connector as recited in claim 1, wherein a curved element defines said front face and said rear face of each said extension; a pair of arms support each said curved element; and said arms have surfaces for abutting said supports of said first hinge assembly.

3. The connector as recited in claim 1, wherein said second contacts have a common height.

4. The connector as recited in claim 1, wherein the connector exhibits an insertion force that generally increases as mating of said first and second contacts progresses from a beginning to an end.

5. The connector as recited in claim 1, wherein said first hinge assembly is part of said first housing and said second hinge assembly is part of said second housing.

6. The connector as recited in claim 1, wherein said first contacts comprise blades angled relative to an axis of said first hinge assembly.

7. The connector as recited in claim 6, wherein said blades are generally perpendicular to said axis of said first hinge assembly.

8. The connector as recited in claim 1, wherein said first and second hinge assemblies allow rotation of said second element relative to said first element.

9. The connector as recited in claim 8, wherein the mating of said first contacts and said second contacts progresses in a direction away from said first and second hinge assemblies.

10. The connector as recited in claim 1, wherein said first contacts are arranged in an array of rows and columns; and said second contacts are arranged in an array of rows and columns;
   whereby the connector progressively mates columns of said first and second contacts.

11. The connector as recited in claim 10, wherein said first and second elements are adapted rotate about an axis of rotation, and said columns of said first and second contacts are generally parallel to said axis of rotation.

12. The connector as recited in claim 1, wherein said first and second elements rotate about an axis of rotation, and said first and second contacts are angled relative to said axis of rotation.

13. The connector as recited in claim 12, wherein said first and second contacts are generally perpendicular to said axis of rotation.

14. The connector as recited in claim 1, wherein said first element further comprises a plurality of fusible elements, each connected to a respective one of said first contacts; and said second element further comprises a plurality of fusible elements, each connected to a respective one of said second contacts.

15. The connector as recited in claim 14, wherein said fusible elements comprise solder balls.

16. The connector as recited in claim 1, wherein said first element further comprises a first frame releasably engaging said first housing; and said second element further comprises a second frame releasably engaging said second housing.

17. The connector as recited in claim 16, wherein said first hinge assembly is on said first frame and said second hinge assembly is on said second frame.

18. The connector as recited in claim 17, wherein said first and second frames comprise metal.

19. A board-to-board array connector, comprising:
   a first element attachable to a circuit board and comprising:
      a first insulative housing having an end;
      a first hinge assembly at said end of said first housing; and
      a plurality of first contacts secured to said first housing and arranged in a series of columns parallel to said first hinge assembly; and
   a second element attachable to another circuit board and comprising:

a second insulative housing having an end;

a second hinge assembly at said end of said second housing and removably engageable with said first hinge assembly along an axis; and a plurality of second contacts secured to said second housing, arranged in a series of columns parallel to said second hinge assembly, and matable with said first contacts;

wherein said second element is rotatable relative to said first element to progressively mate columns of said first and second contacts in a direction away from said first and second hinge assemblies.

20. The connector as recited in claim 19, wherein said second contacts have a common height.

21. The connector as recited in claim 19, wherein said first hinge assembly is part of said first housing and said second hinge assembly is part of said second housing.

22. The connector as recited in claim 19, wherein said first hinge assembly comprises:

a hinge pin;

a plurality of supports bracing said hinge pin; and a block residing between adjacent supports; and said second hinge assembly comprises a plurality of extensions, each including: a front face for engaging said hinge pin; and a rear face for engaging said block.

23. The connector as recited in claim 22, wherein a curved element defines said front face and said rear face of each said extension; a pair of arms support each curved element; and said arms have surfaces for abutting said supports of said first hinge assembly.

24. The connector as recited in claim 19, wherein said first element further comprises a plurality of fusible elements, each connected to a respective one of said first contacts; and said second element further comprises a plurality of fusible elements, each connected to a respective one of said second contacts.

25. The connector as recited in claim 24, wherein said fusible elements comprise solder balls.

26. The connector as recited in claim 19, wherein said first and second contacts are angled relative to said axis.

27. The connector as recited in claim 26, wherein said first and second contacts are generally perpendicular to said axis.

28. The connector as recited in claim 19, wherein said first element comprises a first frame engaging said first insulative housing; and said second element comprises a second frame engaging said second insulative housing.

29. The connector as recited in claim 28, wherein said first hinge assembly is on said first frame and said second hinge assembly is on said second frame.

30. The connector as recited in claim 29, wherein said first and second frames comprise metal.

31. A method of mating a connector, comprising the steps of:

providing a first element, said first element comprising:

a first insulative housing;

a plurality of first contacts secured to said first housing; and an opening in said first element, said opening having a first guide surface and a second guide surface;

providing a second element, said second element comprising:

a second insulative housing;

a plurality of second contacts secured to said second housing; and an extension on said second element, said extension includes with a first surface and a second surface;

engaging said opening of said first element with said extension of said second element;

rotating said second element relative to said first element to achieve a mated position and to progressively connect said first element contacts with said second element contacts; and controlling lateral and longitudinal positioning of said second element during movement of said first and second surfaces across said first and second guide surfaces.

32. The method of mating a connector as recited in claim 31, wherein the rotating step includes the step of initially mating a column of contacts of said first and second element contacts that are closest to said extension and said opening.

33. The method of mating a connector as recited in claim 31, wherein the second element providing step includes the step of providing a plurality of contacts having a common height.

34. The method of mating a connector as recited in claim 31, wherein said opening is part of a first hinge assembly on said first element and said extension is part of a second hinge assembly on said second element; and the engaging step comprises the step of engaging said first hinge assembly with said second hinge assembly.

35. The method of mating a connector as recited in claim 34, wherein the rotating step comprises the step of progressively connecting said first and second element contacts in a direction away from said hinge assemblies.

36. The method of mating a connector as recited in claim 31, wherein the first element providing step includes the step of providing an array of contacts arranged in a series of rows and columns; the second element providing step includes the step of providing an array of contacts arranged in a series of rows and columns; and the rotating step comprises the step of progressively mating columns of said first and second element contacts.

37. The method of mating a connector as recited in claim 36, wherein said first and second elements rotate about an axis of rotation, and said columns of said first and second contacts are substantially parallel to said axis of rotation.

38. The method of mating a connector as recited in claim 37, wherein said first and second contacts are angled relative to said axis.

39. The method of mating a connector as recited in claim 38, wherein said first and second contacts are generally perpendicular to said axis.

40. The method of mating a connector as recited in claim 31, further comprising the steps of:

securing said first element to a substrate; and securing said second element to another substrate.

41. The method of mating a connector as recited in claim 40, further comprising the steps of:

providing a plurality of fusible elements; and securing each fusible elements to a respective one of said contacts;

wherein said first and second element securing steps comprise the step of reflowing said fusible elements.

42. The method of mating a connector as recited in claim 41, wherein the fusible element providing step comprises the step of providing solder balls.

* * * * *